United States Patent [19]

Hashimoto

[11] Patent Number: 5,204,972

[45] Date of Patent: Apr. 20, 1993

[54] ARRANGEMENT FOR COMPENSATING FOR TEMPERATURE DEPENDENT PERFORMANCE CHARACTERISTICS OF SURFACE ACOUSTIC WAVE FILTER

[75] Inventor: Kazuya Hashimoto, Tokyo, Japan

[73] Assignee: NEC Corporation, Japan

[21] Appl. No.: 895,141

[22] Filed: Jun. 5, 1992

Related U.S. Application Data

[63] Continuation of Ser. No. 555,077, Jul. 18, 1990, abandoned.

[30] Foreign Application Priority Data

Jul. 18, 1989 [JP] Japan .................................. 1-184913
Jul. 26, 1989 [JP] Japan .................................. 1-193746

[51] Int. Cl.⁵ .............................................. H04B 1/26
[52] U.S. Cl. .................................... 455/207; 455/264; 455/307; 455/316; 331/176
[58] Field of Search ............... 455/213, 207, 208, 209, 455/256, 262, 264, 266, 307, 315–318, 338, 339; 331/66, 176

[56] References Cited

U.S. PATENT DOCUMENTS

| | | | |
|---|---|---|---|
| 4,262,361 | 4/1981 | Hauer ................................... | 455/113 |
| 4,551,856 | 11/1985 | Victor et al. ......................... | 455/183 |
| 4,575,761 | 3/1986 | Carlson et al. ..................... | 358/191.1 |
| 4,611,181 | 9/1986 | Fukumura et al. .................. | 331/66 |
| 4,644,297 | 2/1987 | Olds ..................................... | 331/17 |
| 4,703,520 | 10/1987 | Razanski et al. ..................... | 455/75 |
| 4,910,473 | 3/1990 | Niwa .................................... | 331/176 |
| 4,921,467 | 5/1990 | Lax ...................................... | 455/264 |

Primary Examiner—Reinhard J. Eisenzopf
Assistant Examiner—Chi H. Pham
Attorney, Agent, or Firm—Ostrolenk, Faber, Gerb & Soffen

[57] ABSTRACT

A first control circuit is provided with a temperature detector and a memory in which temperature related control data is stored. The control circuit outputs a control signal, which varies with ambient temperature, to a local oscillator which is connected with a mixer. The mixer receives an incoming radio frequency signal and a local frequency signal from the local oscillator and outputs an IF signal. The local oscillator is controlled in a manner wherein the frequency of the IF signal parallels the temperature dependent shift in center frequency of a surface acoustic wave type IF filter. The IF signal is applied to a second mixer to which a second control circuit is coupled. The second control circuit maintains the output of the second mixer at a predetermined value to compensate for the first IF's frequency shift caused by the first control circuit.

8 Claims, 6 Drawing Sheets

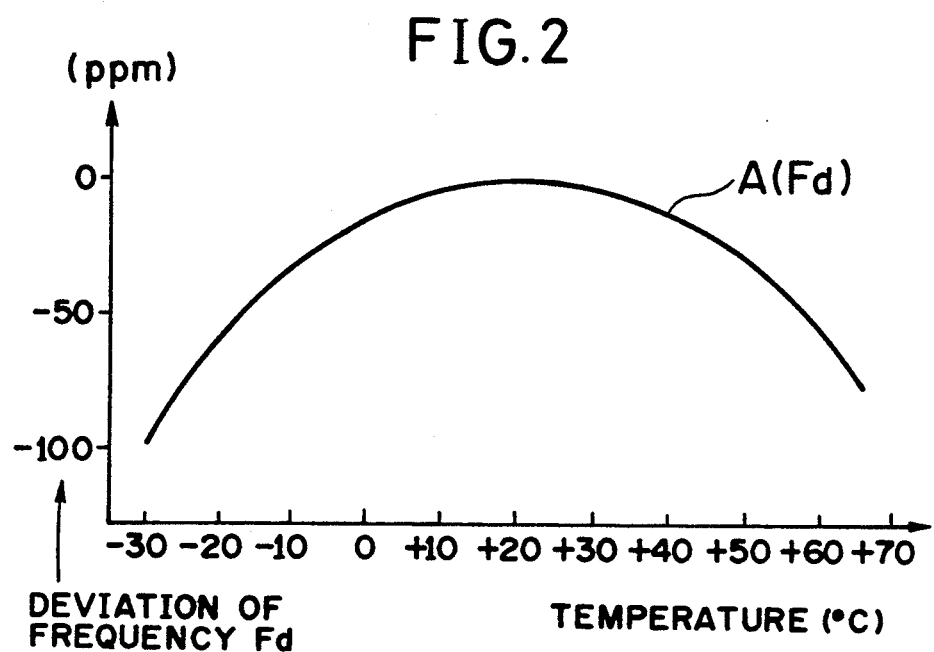
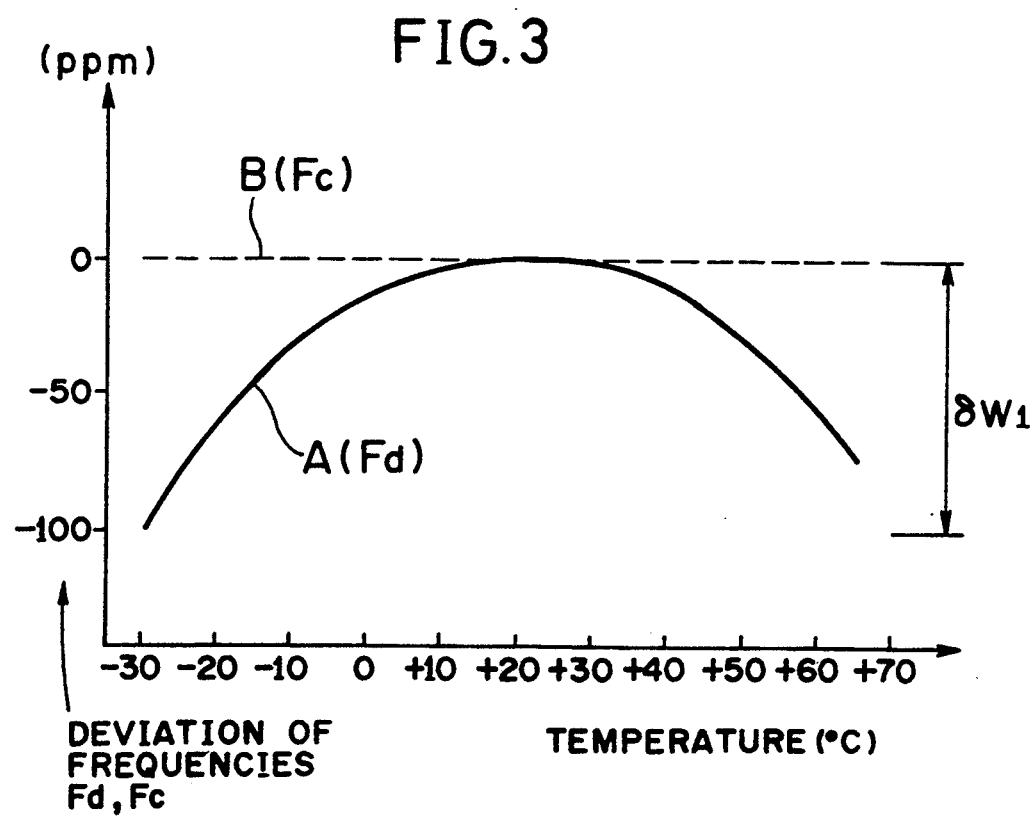

ARRANGEMENT FOR COMPENSATING FOR TEMPERATURE DEPENDENT PERFORMANCE CHARACTERISTICS OF SURFACE ACOUSTIC WAVE FILTER

This is a continuation of application Ser. No. 07/555,077, filed on Jul. 18, 1990 now abandoned.

BACKGROUND OF THE INVENTION

1. Field for the Invention

The present invention relates to an arrangement of compensating for temperature dependent characteristics of a surface acoustic wave (SAW) filter. An SAW filter, with which the present invention may be employed as concerned, is an intermediate frequency (IF) band-pass filter provided in a first IF stage of a double-superheterodyne receiver.

2. Description of the Prior Art

As is well known, a superheterodyne receiver is a receiver in which all incoming modulated radio-frequency carrier signals are converted, using a heterodyne action, to a common IF carrier value for additional amplification and selectivity prior to demodulation.

On the other hand, a double-superheterodyne receiver is a type which utilizes two frequency converters before final detection.

A double-superheterodyne receiver, as commonly used in a mobile telecommunications systems or the like, comprises a first IF stage in which a first mixer generates a relatively high IF (by way of example, 90 MHz). In order to deal with such a high intermediate frequency, a crystal filter has been found to be suitable in that a highly selective filtering can be expected.

However, such a crystal filter is expensive and requires cumbersome adjustments when both manufactured and installed. As a consequence, it is a current practical tendency to use an SAW band-pass filter in place of a crystal filter in the first IF stage of a double superheterodyne receiver. That is to say, a SAW filter is inexpensive and easy to install. A SAW filter consists of a piezoelectric bar with a polished surface along which surface acoustic waves can propagate.

As mentioned above, an SAW band-pass filter is found advantageous in connection with cost and performance and easy installation into a receiver, but a difficulty has been encountered in that an SAW filter's performance characteristics tend to be overly susceptible to ambient temperature changes.

Before describing the present invention, a known double superheterodyne reception arrangement using a SAW intermediate filter will be discussed with reference to FIG. 1.

It should be noted that, throughout the instant specification, each signal and corresponding frequency thereof will be denoted by corresponding reference characters for the sake of convenience.

As shown in FIG. 1, mixer 10 in a first IF stage is supplied with a radio frequency (RF) modulated carrier signal Fa through an input terminal 12. The input signal Fa (by way of example, 900 MHz) is frequency converted at the first mixer 10 by multiplication with a locally generated signal (by way of example, 990 MHz) outputted from a first local oscillator 14. An output Fc of the first mixer 10 is then filtered by an SAW type band-pass filter 16 whose center frequency is denoted by Fd.

The first local oscillator 14 takes the form of frequency synthesizer and includes a reference oscillator 18 which generates a signal which exhibits suitable frequency accuracy and stability to satisfy system requirements. An output of the reference oscillator 18 is applied to a phase detector 20 which also receives a signal from a variable frequency divider (viz., programmable counter) 22. The phase detector 20 compares the phases of the two signals applied and generates an error signal which is proportional to the phase difference between said two signals. The error signal is filtered by a loop filter (low-pass filter (LPF)) 24 which smoothes and shapes it into a voltage suitable for controlling a voltage controlled oscillator (VCO) 26. The output of the VCO 26, denoted by Fb, is applied to the first mixer 10 and also split and fed back to the programmable counter 22 by way of a prescaler 28. When the output of the low-pass filter 24 is applied to the VCO 26, the output frequency of the VCO 26 is induced to change in a direction to establish a constant phase difference (typically "zero") between the two signals applied to the phase detector 20. The arrangement of the first local oscillator 14 is well known in the art.

The output of the first IF band-pass filter (SAW band-pass filter) 16, denoted by Fe, is subject to second frequency conversion at a second mixer 30 via multiplication with a local frequency Ff (by way of example, 89.545 MHz) applied from a second local oscillator 32. The output of the second mixer 30, denoted by Fg (by way of example, 545 KHz), is applied to external circuitry through a second band-pass filter 34, an amplifier 36 and an output terminal 38. The local oscillator 32 is a high precision oscillator such as a crystal controlled oscillator.

As mentioned previously, the SAW band-pass filter 16 inherently has performance characteristics which undesirably vary with ambient temperature changes. FIG. 2 is a graph which shows (in ppm) the manner in which the center frequency Fd of the SAW filter 16 deviates with respect to ambient temperature. As shown by curve A, the degree by which the center frequency Fd deviates, increases as an ambient temperature varies above and below about room temperature (for example).

FIG. 3 compares curve A, which is the same as that shown in FIG. 2, with curve B, which is a plot of frequency deviations (in ppm) exhibited by the first intermediate frequency Fc, with respect to ambient temperature changes. It should be noted, however, that the first intermediate frequency Fc is shifted or deviated very little, if at all, with respect to ambient temperature changes as shown in FIG. 3.

As will be appreciated the frequency difference between the two curves A and B increases as the temperature increases and decreases from a predetermined temperature range.

It is assumed that the maximum frequency difference between the two curves A and B corresponds to a bandwidth δW1 (FIG. 3). As a consequence, the pass-band of the SAW band-pass filter 16 must be augmented in accordance with the bandwidth δW1 as shown in FIG. 4. In this figure (a) "Fd'" denotes a center frequency of the SAW band-pass filter 16 (viz., a center frequency of a given channel) and (b) "Fx" denotes a center frequency of an adjacent channel.

More specifically, in the event that an originally planned bandwidth Wor of a given channel is not expanded, the desired incoming channel will be contaminated by the adjacent channel Fx. In other words, according to the known arrangement shown in FIG. 1, due to the temperature response characteristics of the SAW filter, the channel spacing between each two adjacent channels must be undesirably increased in order to obviate interchannel interference.

SUMMARY OF THE INVENTION

It is an object of the present invention to provide an arrangement for compensating for temperature dependent performance characteristics of a surface acoustic wave type band-pass filter for use in a double superheterodyne receiver.

Another object of the present invention is to provide a method of compensating for temperature dependent performance characteristics of a surface acoustic wave type band-pass filter for use in a double superheterodyne receiver.

In brief, the above objects are achieved by a control circuit which is provided with a temperature detector and a memory in which temperature related control data is stored. The control circuit outputs a control signal, which varies with temperature, to a local oscillator which is connected with a mixer. The mixer receives an incoming radio frequency signal and a local frequency signal from the local oscillator and outputs an IF signal. The local oscillator is controlled in such a manner that the frequency of the IF signal parallels the temperature dependent shift in center frequency of a surface acoustic wave type IF filter.

More specifically a first aspect of the present invention comes in a double superheterodyne receiver, comprising: a first local oscillator, said first local oscillator generating a first local frequency; a first mixer, said first mixer receiving an incoming radio frequency signal and said first local frequency, said first mixer generating a first IF; a first IF filter, said first IF filter filtering said first IF and having a center frequency which deviates with ambient temperature; and a first controller, said first controller being responsive to temperature for generating a control signal, said control signal being applied to said first local oscillator for controlling said first local frequency in a manner that said first IF varies and follows deviation of said center frequency.

A second aspect of the present invention comes in a double superheterodyne receiver, comprising: a first local oscillator, said first local oscillator generating a first local frequency; a first mixer, said first mixer receiving an incoming radio frequency signal and said first local frequency, said first mixer generating a first IF; a first IF filter, said first IF filter filtering said first IF and having a center frequency which deviates with ambient temperature; a first controller, said first controller being responsive to temperature for generating a control signal, said control signal being applied to said first local oscillator for controlling said first local frequency in a manner that said first IF varies and follows deviation of said center frequency; a second local oscillator, said second local oscillator generating a second local frequency; a second mixer, said second mixer receiving an output of said first IF filter and said second local frequency, said second mixer generating a second IF; a second IF filter, said second IF filter filtering said second IF; and a second controller, said second controller being coupled between said second IF filter and said second local oscillator and forming a phase-locked loop for maintaining said second IF at a predetermined value.

A third aspect of the present invention takes a double superheterodyne receiver, comprising: a first local oscillator, said first local oscillator generating a first local frequency; a first mixer, said first mixer receiving an incoming radio frequency signal and said first local frequency, said first mixer generating a first IF; a first IF filter, said first IF filter filtering said first IF and having a center frequency which deviates with ambient temperature; a second local oscillator, said second local oscillator generating a second local frequency; a second mixer, said second mixer receiving an output of said first IF filter and said second local frequency, said second mixer generating a second IF; a second IF filter, said second IF filter filtering said second IF; a controller, said controller being responsive to temperature for generating first and second control signal, said first control signal being applied to said first local oscillator for controlling said first local frequency in a manner that said first IF varies and follows deviation of said center frequency, said second control signal being applied to said second local oscillator for maintaining said second IF at a predetermined value.

BRIEF DESCRIPTION OF THE DRAWINGS

The features and advantages of the present invention will become more clearly appreciated from the following description taken in conjunction with the accompanying drawings in which like elements are denoted by like reference numerals and in which:

FIG. 2 is a graph showing the deviation of a center frequency of an SAW IF band-pass filter with respect to ambient temperatures;

FIG. 3 is a graph comparing the deviation of a center frequency of an SAW IF band-pass filter with that of a first local frequency;

DETAILED DESCRIPTION OF THE PREEFERRED EMBODIMENTS

Figure 5:
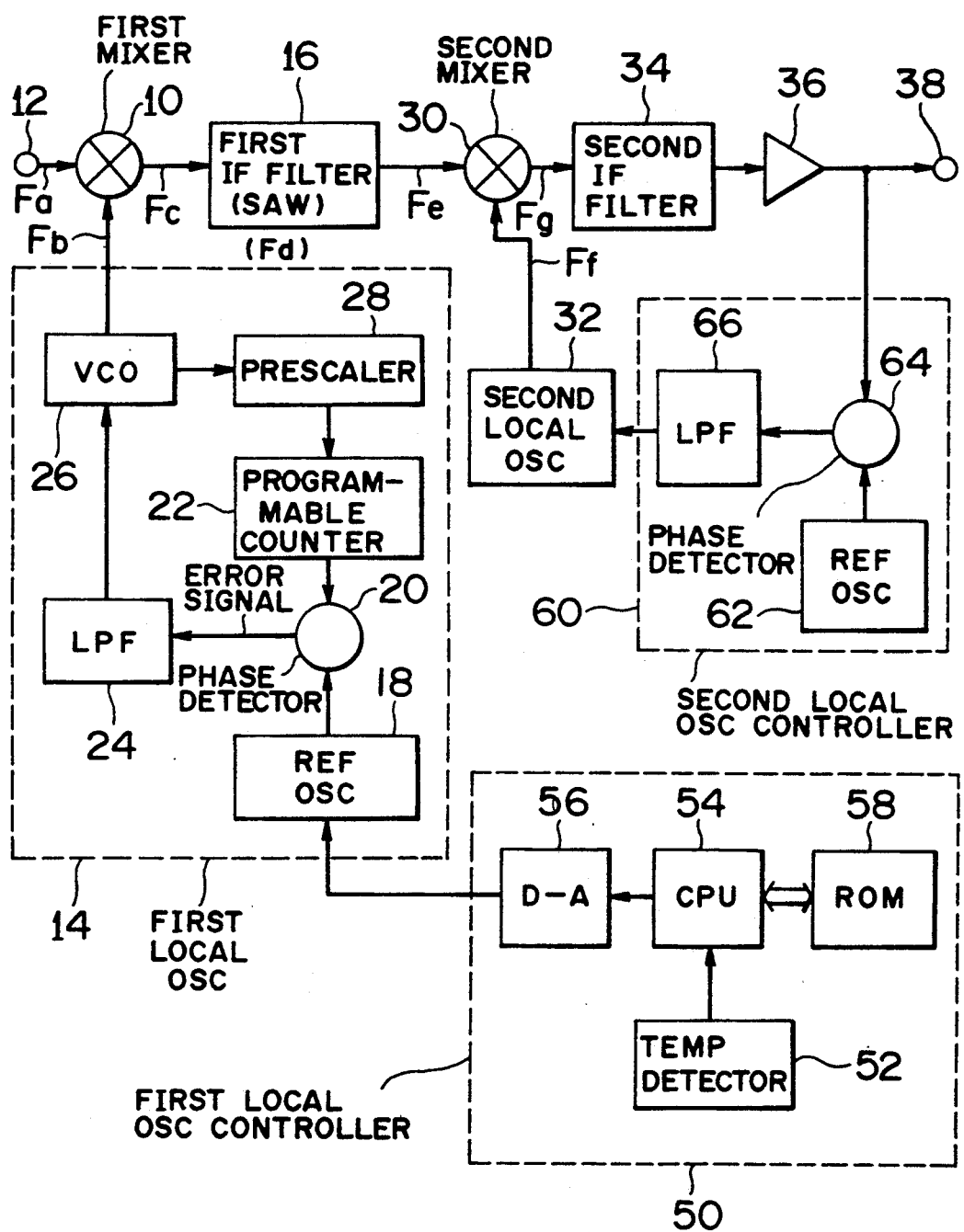
FIG. 5 is a block diagram showing a first embodiment of the present invention.

A first preferred embodiment of this invention will be discussed with reference to FIGS. 5, 6 and 7.

Figure 1:
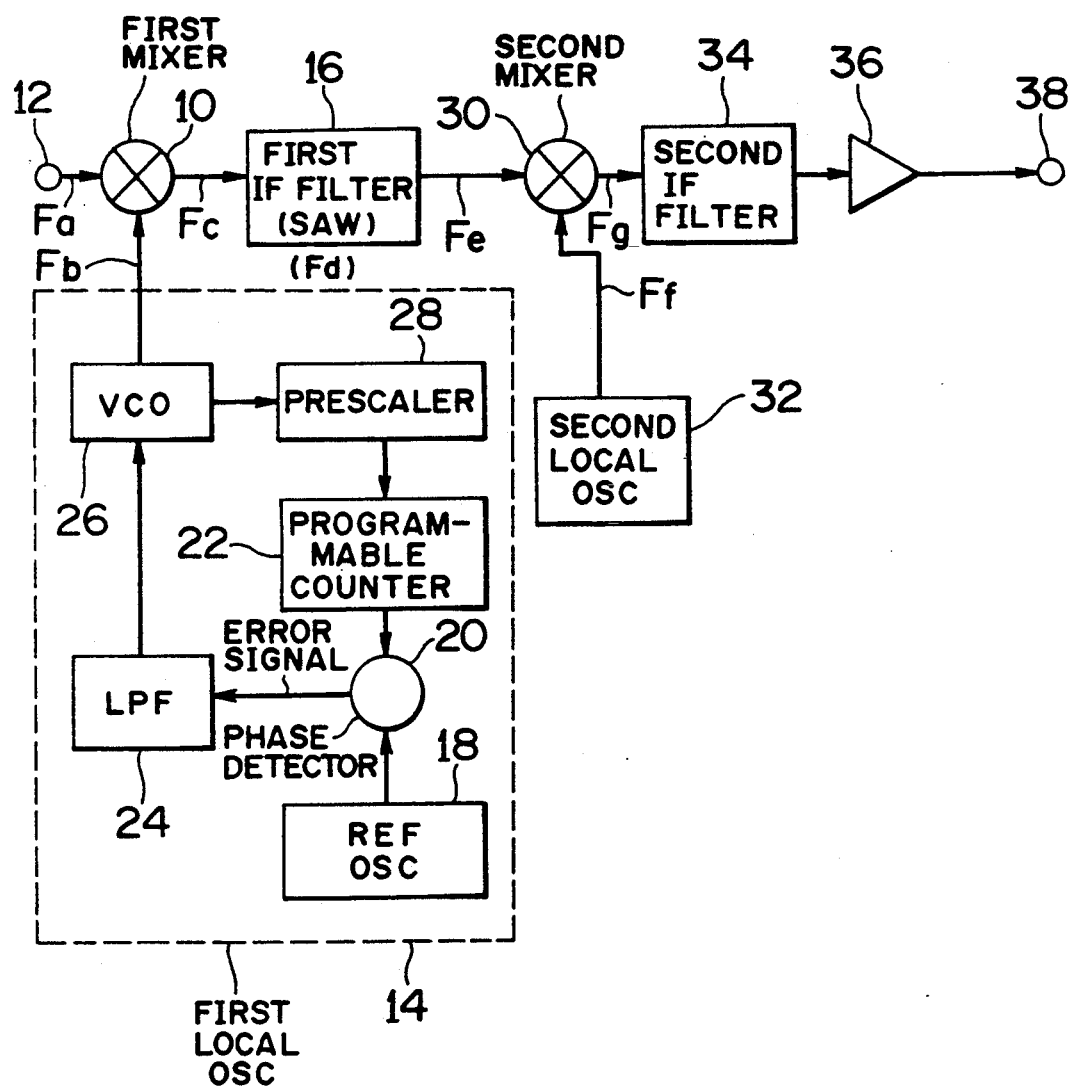
FIG. 1 is a block diagram showing a known double superheterodyne reception arrangement referred to in the opening paragraphs of the instant specification.

The first embodiment features first and second local oscillator controllers 50 and 60. The remaining portions of the FIG. 5 arrangement are exactly the same as those of the FIG. 1 arrangement, and hence the descriptions thereof will be omitted for the sake of brevity.

As shown, the first local oscillator controller 50 includes a temperature detector 52 which ascertains an ambient temperature and applies a corresponding digital output to a central processing unit (CPU) 54. A digital-to-analog (D-A) converter 56 is provided between the CPU 54 and the reference oscillator 18. A read-only-memory (ROM) 58 is coupled to the CPU 54 through a suitable bus. The ROM 58 stores a look-up table which contains a plurality of data via which the frequency outputted from the reference oscillator 18 can be selectively varied. That is to say, the first local frequency Fb is controlled by the data stored in the ROM 58.

Further detailed descriptions of the controller 50 will be given below.

Various frequency values of the reference oscillator 18 are determined such that the first intermediate frequency Fc is able to essentially parallel the changes in the center frequency (Fd) of the SAW type band-pass filter 16 as the ambient temperature varies. In addition to this, the control data to be applied to the reference oscillator 18, is determined in such a manner that the reference oscillator 18 (viz., the first local oscillator 14) is able to change the first intermediate frequency Fc as above mentioned. Thus, the look-up table stored in the ROM 58 is determined which satisfies the above-mentioned requirements.

In the event that the first local frequency Fb is set higher than the incoming carrier frequency Fa, the first intermediate frequency Fc (=Fb−Fa) is controlled to change just as the first local oscillator frequency Fb varies in accordance with changes in an ambient temperature. Accordingly, the changes in the first intermediate frequency Fc follow those in the center frequency Fd of the SAW band-pass filter 16 as shown in FIG. 6.

Figure 6:
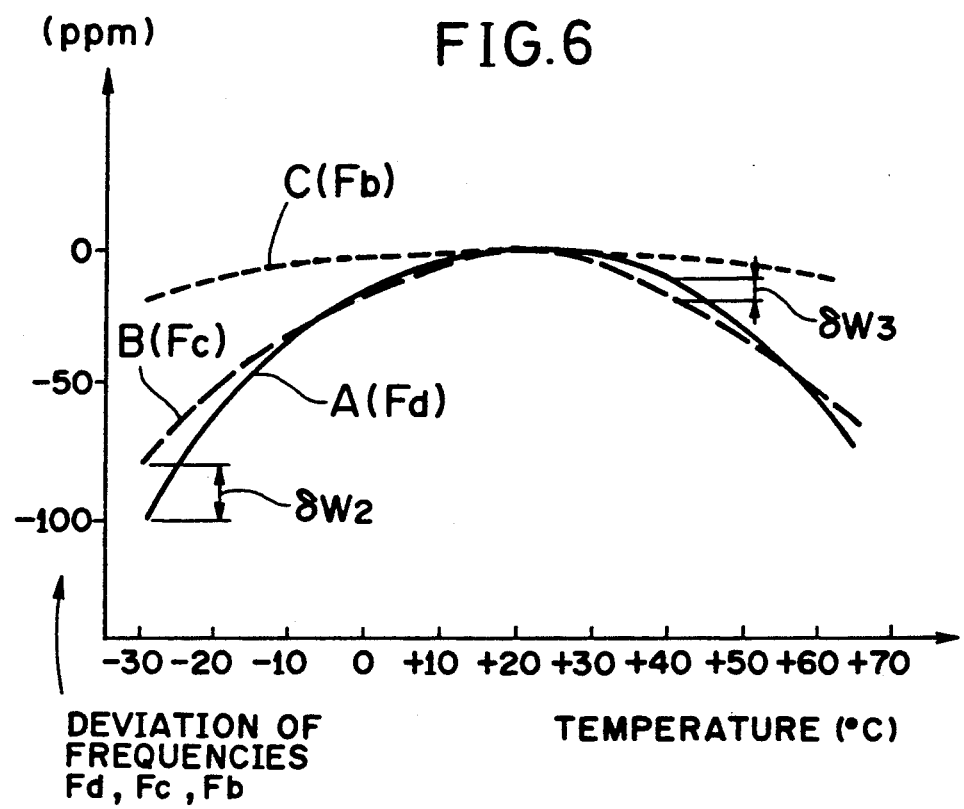
FIG. 6 is an graph showing deviation of three kinds of frequencies appearing in the first embodiment shown in FIG. 5 versus ambient temperature for describing the first embodiment shown in FIG. 5.

More specifically, FIG. 6 indicates that the first local oscillator frequency Fb changes such that the first intermediate frequency Fc varies along with the changes in the center frequency Fd of the SAW band-pass filter 16. It is therefore understood that each of the temperature compensation bandwidths δW2 and δW3, required in the FIG. 5 arrangement, is extensively reduced as compared with δW1 shown in FIG. 3.

Figure 4:
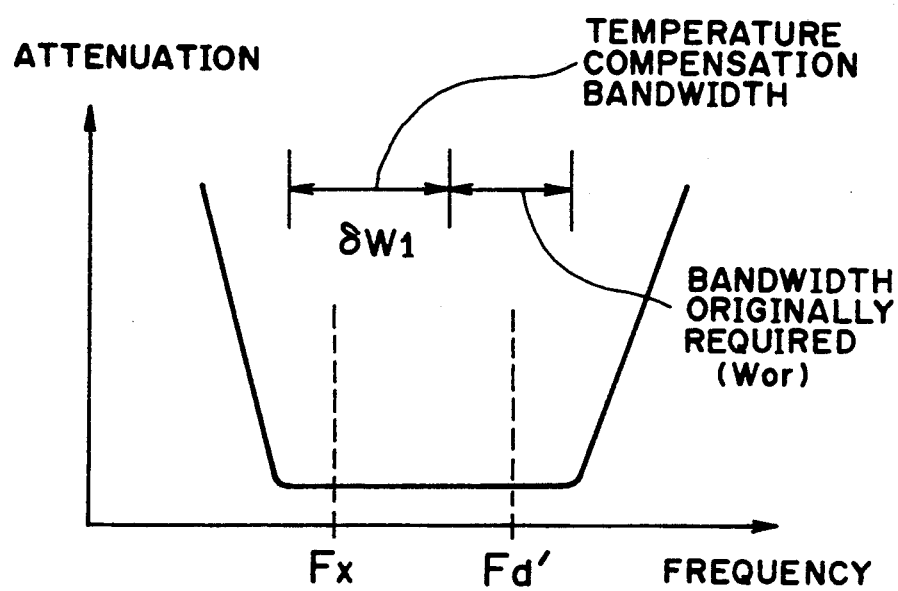
FIG. 4 is a graph showing the attenuation versus frequency characteristics of an SAW IF band-pass filter described in the opening paragraphs of the instant specification.
Figure 7:
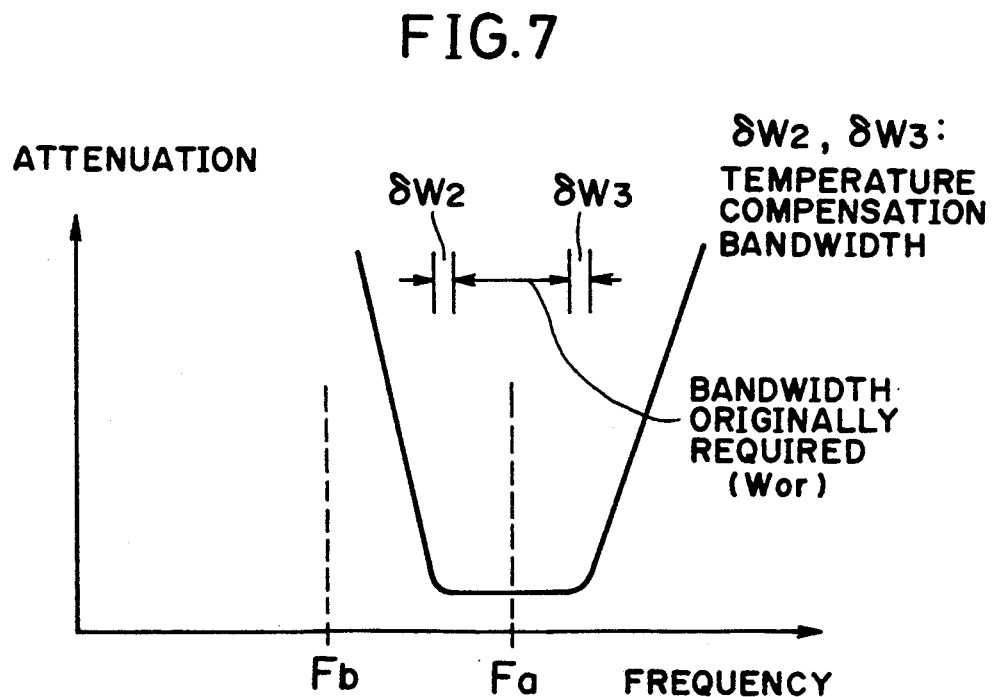
FIG. 7 is a graph showing the attenuation versus frequency characteristics of an SAW IF band-pass filter included in the first embodiment shown in FIG. 5.

FIG. 7 illustrates the attenuation versus frequency characteristics of the SAW IF band-pass filter 16, which is widened by the temperature compensation bandwidths δW2 and δW3. It is clearly seen that the necessary spacing between each two adjacent channels can be markedly narrowed as compared with the known technique (see FIG. 4).

As described above, in order to compensate for temperature dependent decrease in the center frequency Fd of the SAW type IF band-pass filter 16, the first intermediate frequency Fc also decreases. This means that the second intermediate frequency Fg tends to deviate from its predetermined value. It should be noted that it is vital to maintain the second intermediate frequency Fg at the predetermined value irrespective of frequency changes in the first IF stage (viz., the output frequency Fe of the SAW filter 16).

The second local oscillator controller 60 is provided to compensate for the above-mentioned frequency changes in the second intermediate frequency Fg which result from the compensation for the temperature dependent frequency deviation in the first IF stage, as above mentioned.

The second local oscillator controller 60 comprises a reference oscillator 62, a phase detector 64 and a low-pass controlled oscillator 66. Each of the oscillators 32 and 62 is a high precision oscillator such as a crystal filter by which a very stable and precise frequency can be generated irrespectively of ambient temperature changes.

The controller 60 takes the form of a phase-locked loop, and the operation thereof will briefly be described. The output of the amplifier 36 is split and applied to the phase detector 64 which compares a phase difference between the two frequencies applied thereto. The phase detector 64 generates an error signal which is proportional to the phase difference between the two signals applied thereto. The error signal is filtered by the low-pass filter 66 which smoothes and shapes it into a voltage suitable for controlling the second local oscillator 32. Thus, the second IF Fg is controlled to assume a predetermined value independently of the frequency changes in the first IF stage.

Figure 8:
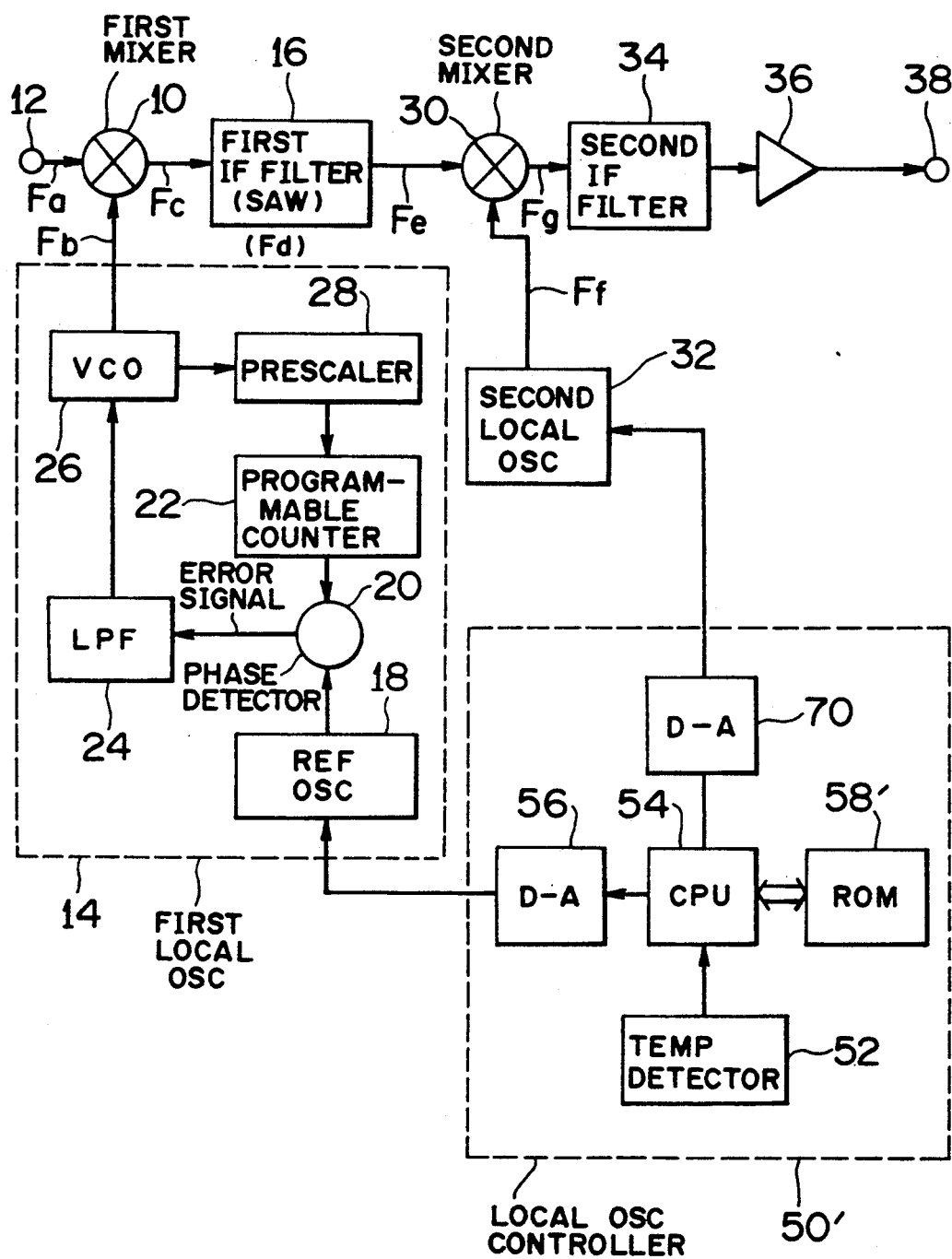
FIG. 8 is a block diagram showing a second embodiment of the present invention.

A second embodiment of this invention will be described with reference to FIG. 8.

The second embodiment features a local oscillator controller 50', which differs from the first local oscillator controller 50 (FIG. 5) in that the controller 50' further includes a D-A converter 70. More specifically, the second embodiment 50' controls the second local oscillator 32 using the CPU 54 instead of a phase-locked loop. The remaining portions of the second embodiment are exactly the same as those of the first embodiment shown in FIG. 5 and hence the descriptions thereof will be omitted for brevity.

The ROM 58' in the second embodiment stores two kinds of look-up tables. A first look-up table is the same as that referred to in the first embodiment, while a second look-up table contains data for maintaining the second intermediate frequency Fg at a predetermined value irrespective of frequency changes in the first IF stage. In more detail, in the event that the first intermediate frequency Fe is decreased under the control of the data in the first look-up table, then the second local oscillator 32 should be controlled to compensate for the first IF deviation using the data stored in the second look-up table. It is not difficult to determine the relationship between the data of the two look-up tables.

As seen from the foregoing, according to the present invention, the temperature dependent frequency deviation in an SAW band-pass filter can effectively be compensated for. Accordingly, it is no longer required to undesirably expand the channel spacing when using an SAW band-pass filter as in the conventional arrangement.

While the foregoing description describes two-embodiments according to the present invention, the various alternatives and modifications that can be developed without departing from the scope of the present invention, which is limited only by the appended claims, will be apparent to those skilled in the art.

What is claimed is:

1. A double superheterodyne receiver, comprising:
    a first local oscillator for generating a first local frequency;
    a first mixer which receives an incoming radio frequency signal and said first local frequency, said first mixer generating a first IF signal;
    a first IF filter being coupled to receive said first IF signal and having a center frequency which deviates with ambient temperature;
    a first controller which detects ambient temperature and generates a control signal as a function of temperature data, said control signal being applied to said first local oscillator for controlling said first local frequency in a manner that the frequency of said first IF signal varies as a function of deviation of said center frequency;

a second local oscillator for generating a second local frequency;

a second mixer which receives an output of said first IF filter and said second local frequency, said second mixer generating a second IF signal having a predetermined frequency value; and a second controller, coupled to said second local oscillator, and effective for maintaining the frequency of said second IF signal at said predetermined frequency value irrespective of frequency variations associated with said first IF filter.

2. A double superheterodyne receiver as claimed in claim 1, wherein said first IF filter is a surface acoustic wave type filter.

3. A double superheterodyne receiver as claimed in claim 1, wherein said first controller comprises:

a temperature detector for generating a signal corresponding to ambient temperature detected;

a memory storing a look-up table which includes said temperature data for controlling said first local frequency in such a manner that the frequency of said first IF signal varies and follows deviation of said center frequency; and a data processing unit, coupled to said temperature detector and said memory, for generating said control signal by referring to said look-up table in accordance with the signal applied from said temperature detector.

4. A double superheterodyne receiver as claimed in claim 3, wherein said first IF filter is a surface acoustic wave type filter.

5. A double superheterodyne receiver, comprising:

a first local oscillator for generating a first local frequency;

a first mixer which receives an incoming radio frequency signal and said first local frequency, said first mixer generating a first IF signal;

a first IF filter being coupled to receive said first IF signal and having a center frequency which deviates with ambient temperature;

a second local oscillator for generating a second local frequency;

a second mixer which receives an output of said first IF filter and said second local frequency, said second mixer generating a second IF signal having a predetermined frequency value; and a controller which detects ambient temperature and generates first and second control signals using temperature data, said first control signal being applied to said first local oscillator for controlling said first local frequency in such a manner that the frequency of said first IF signal varies and follows deviations of said center frequency, said second control signal being applied to said second local oscillator, and being effective for maintaining the frequency of said second IF signal at said predetermined frequency value irrespective of frequency variations associated with said first IF filter.

6. A double superheterodyne receiver as claimed in claim 5, wherein said first IF filter is a surface acoustic wave type filter.

7. A double superheterodyne receiver as claimed in claim 5, wherein said controller comprises:

a temperature detector for generating a signal corresponding to temperature detected;

a memory storing first and second look-up tables, said first look-up table including temperature data for controlling said first local frequency in such a manner that said first intermediate frequency varies and follows deviation of said center frequency, said second look-up table including temperature data for maintaining said second intermediate frequency at a predetermined value; and a data processing unit, coupled to said temperature detector and said memory, for generating said first and second control signals by referring to said first and second look-up tables respectively, in accordance with the signal from said temperature detector.

8. A double superheterodyne receiver as claimed in claim 7, wherein said first IF filter is a surface acoustic wave type filter.

* * * * *